(12) United States Patent
Mandal et al.

(10) Patent No.: US 7,265,062 B2
(45) Date of Patent: Sep. 4, 2007

(54) IONIC ADDITIVES FOR EXTREME LOW DIELECTRIC CONSTANT CHEMICAL FORMULATIONS

(75) Inventors: Robert P. Mandal, Saratoga, CA (US); Alexandros T. Demos, Fremont, CA (US); Timothy Weidman, Sunnyvale, CA (US); Michael P. Nault, San Jose, CA (US); Nikolaos Bekiaris, San Jose, CA (US); Scott Jeffrey Weigel, Allentown, PA (US); Lee A. Senecal, Vista, CA (US); James E. Mac Dougall, New Tripoli, PA (US); Hareesh Thridandam, Vista, CA (US)

(73) Assignees: Applied Materials, Inc., Santa Clara, CA (US); Air Products and Chemicals, Inc., Allentown, PA (US)

( * ) Notice: Subject to any disclaimer, the term of this patent is extended or adjusted under 35 U.S.C. 154(b) by 386 days.

(21) Appl. No.: 10/636,517

(22) Filed: Aug. 7, 2003

(65) Prior Publication Data

US 2004/0087184 A1     May 6, 2004

Related U.S. Application Data

(63) Continuation-in-part of application No. 10/219,164, filed on Aug. 13, 2002, now Pat. No. 6,896,955, which is a continuation of application No. 09/823,932, filed on Mar. 29, 2001, now Pat. No. 6,576,568.

(60) Provisional application No. 60/194,356, filed on Apr. 4, 2000.

(51) Int. Cl.
*H01L 21/31*     (2006.01)

(52) U.S. Cl. .................... 438/780; 438/781; 438/782; 257/E21.273

(58) Field of Classification Search ................ 438/758, 438/780, 781, 787; 427/255.11, 372.2, 376.2, 427/419.2
See application file for complete search history.

(56) References Cited

U.S. PATENT DOCUMENTS 5,548,159 A     8/1996    Jeng (Continued)

FOREIGN PATENT DOCUMENTS

EP     0689235     12/1995

(Continued)

OTHER PUBLICATIONS

Rust, W., "Using Spin-on Dielectrics to Solve Interconnect Challenges," Channel Techwatch, vol. 10, No. 9 (1997).

(Continued)

*Primary Examiner*—Alexander Ghyka
(74) *Attorney, Agent, or Firm*—Townsend and Townsend and Crew

(57) ABSTRACT

A process for depositing porous silicon oxide-based films using a sol-gel approach utilizing a precursor solution formulation which includes a purified nonionic surfactant and an additive among other components, where the additive is either an ionic additive or an amine additive which forms an ionic ammonium type salt in the acidic precursor solution. Using this precursor solution formulation enables formation of a film having a dielectric constant less than 2.5, appropriate mechanical properties, and minimal levels of alkali metal impurities. In one embodiment, this is achieved by purifying the surfactant and adding ionic or amine additives such as tetraalkylammonium salts and amines to the stock precursor solution.

13 Claims, 1 Drawing Sheet

U.S. PATENT DOCUMENTS

| | | |
|---|---|---|
| 5,645,891 A | 7/1997 | Liu et al. |
| 5,736,425 A | 4/1998 | Smith et al. |
| 5,747,880 A | 5/1998 | Havemann et al. |
| 5,807,607 A | 9/1998 | Smith et al. |
| 5,814,370 A | 9/1998 | Martino et al. |
| 5,834,845 A | 11/1998 | Stolmeijer |
| 5,847,443 A | 12/1998 | Cho et al. |
| 5,858,457 A | 1/1999 | Brinker et al. |
| 5,858,871 A | 1/1999 | Jeng |
| 5,922,299 A | 7/1999 | Bruinsma et al. |
| 5,948,482 A | 9/1999 | Brinker et al. |
| 5,955,140 A | 9/1999 | Smith et al. |
| 6,011,123 A | 1/2000 | Kurosawa et al. |
| 6,015,457 A | 1/2000 | Leung et al. |
| 6,037,275 A | 3/2000 | Wu et al. |
| 6,107,357 A | 8/2000 | Hawker et al. |
| 6,120,891 A | 9/2000 | Balkus, Jr. et al. |
| 6,140,252 A | 10/2000 | Cho et al. |
| 6,159,295 A | 12/2000 | Maskara et al. |
| 6,162,583 A | 12/2000 | Yang et al. |
| 6,162,838 A | 12/2000 | Kohl |
| 6,163,066 A | 12/2000 | Forbes et al. |
| 6,168,737 B1 | 1/2001 | Poco et al. |
| 6,171,645 B1 | 1/2001 | Smith et al. |
| 6,171,687 B1 | 1/2001 | Leung et al. |
| 6,172,128 B1 | 1/2001 | Lau et al. |
| 6,184,260 B1 | 2/2001 | Zhong |
| 6,187,248 B1 | 2/2001 | O'Neill et al. |
| 6,197,913 B1 | 3/2001 | Zhong |
| 6,204,202 B1 | 3/2001 | Leung et al. |
| 6,208,014 B1 | 3/2001 | Wu et al. |
| 6,270,846 B1 | 8/2001 | Brinker et al. |
| 6,277,765 B1 | 8/2001 | Chen et al. |
| 6,297,459 B1 | 10/2001 | Wojnarowski et al. |
| 6,356,266 B1 * | 3/2002 | Strickling, III .......... 345/440.1 |
| 6,365,266 B1 | 4/2002 | MacDougall et al. |
| 6,576,568 B2 | 6/2003 | Mandal et al. |
| 2002/0102396 A1 | 8/2002 | MacDougall et al. |
| 2003/0157311 A1 | 8/2003 | MacDougall et al. |
| 2003/0224156 A1 | 12/2003 | Kimer et al. |

FOREIGN PATENT DOCUMENTS

| | | |
|---|---|---|
| EP | 0869515 | 7/1998 |
| FR | 2621030 | 3/1989 |
| WO | WO98/24724 | 7/1998 |
| WO | WO99/03926 | 1/1999 |
| WO | WO99/23101 | 5/1999 |
| WO | WO99/37705 | 7/1999 |
| WO | WO 00/08679 | 2/2000 |
| WO | WO 00/13221 | 3/2000 |
| WO | WO00/13221 * | 9/2000 |

OTHER PUBLICATIONS

Peters L., "Solving the integration Challenges of Low-k Dielectrics," Semiconductor Int'l, 56-54 (1999).

Singer, P., "Dual-Damascene Challenges Dielectric Etch," Semiconductor Int'l., 68-72 (1999).

Hendricks, N., "Low K Materials for IC International Dielectric Applications: An Updated Status on the Leading Candidates," Low K Dielectric Mat. Tech., SEMICON West, B1-B12 (1999).

Patent Abstracts of Japan, Publication No. 03008709, Published Jan. 16, 1991.

Patent Abstracts of Japan, Publication No. 11035315, Published Feb. 9, 1999.

* cited by examiner

IONIC ADDITIVES FOR EXTREME LOW DIELECTRIC CONSTANT CHEMICAL FORMULATIONS

CROSS-REFERENCES TO RELATED APPLICATIONS

This application is a continuation-in-part application of U.S. patent application Ser. No. 10/219,164, filed on Aug. 13, 2002, which is a continuation of U.S. patent application Ser. No. 09/823,932, filed on Mar. 29, 2001, now U.S. Pat. No. 6,592,980, which claims the benefit of U.S. Provisional Application No. 60/194,356 filed Apr. 4, 2000. These applications are herein incorporated by reference in their entirety for all purposes.

BACKGROUND OF THE INVENTION

The present invention relates to the formation of dielectric layers. More particularly, the present invention relates to a method for forming a low dielectric constant film that is particularly useful as a premetal or intermetal dielectric layer in an integrated circuit.

Semiconductor device geometries have dramatically decreased in size since integrated circuits were first introduced several decades ago, and all indications are that this trend will continue. Although today's wafer fabrication plants are routinely producing ever-shrinking devices, the plants of the future will soon be producing devices having even smaller geometries.

In order to continue to reduce the size of devices on integrated circuits, it has become necessary to use insulators having a low dielectric constant. Such films are particularly desirable for premetal dielectric (PMD) layers and intermetal dielectric (IMD) layers to reduce the RC time delay of the interconnect metallization, to prevent crosstalk between the different levels of metallization, and to reduce device power consumption. To this end, several semiconductor manufacturers, materials suppliers and research organizations have focused on identifying low and extremely low dielectric constant films. As used herein, low dielectric constant materials are those films having a dielectric constant between 2.5 to 3.0 and extremely low dielectric constant ("ELk") films are those films having a dielectric constant below 2.5 extending to dielectric constants below 2.0.

One approach for reducing the dielectric constant includes introducing high porosity into the dielectric film layer. The dielectric constant of air is nominally 1. Thus, dielectric films when made porous, tend to have much lower dielectric constants relative to solid dielectric films, and values of dielectric constants less than 2.5 are becoming achievable.

One method of forming a particular type of ELk material is based on a sol-gel process, in which a high porosity film is produced by hydrolysis and polycondensation of a silicon alkoxide such as tetraethylorthosilicate (TEOS). The sol-gel process is a versatile solution process for making both ceramic and organosilicate materials. In general, the sol-gel process involves the transition of a system from a homogeneous liquid "sol" (mostly colloidal) into a solid "gel" phase. The starting materials used in the preparation of the "sol" are usually inorganic salts or compounds such as silicon alkoxides. The precursor solutions are typically deposited on a substrate by spin on methods. In a typical sol-gel process, the precursor is subjected to a series of hydrolysis and polymerization reactions to form a colloidal suspension, or a "sol." A typical sol-gel process is described in U.S. Pat. No. 6,264,741 to Brinker et al. Further processing of the "sol" enables one to make ceramic materials in different forms. The further processing may include the thermal decomposition of a thermally labile component, which may include the formation of an ordered surfactant-templated mesostructured film by evaporation-induced self-assembly, followed by the thermal decomposition of the template. Another sol-gel process is described in U.S. Pat. No. 5,645,891 to Liu et al.

In a particular sol-gel-based process for forming a porous low dielectric constant film, surfactants act as the template for the film's porosity. The porous film is generally formed by depositing a sol-gel precursor on a substrate, and then selectively evaporating solvent components of the sol-gel precursor to form supramolecular assemblies. The assemblies are then formed into porous films by the pyrolysis of the surfactants at a temperature range between approximately 300 and 450° C. This particular sol-gel-based process can produce porous films with controllable pore size and advantageously, with narrow distributions of pore size, which is beneficial for integrated circuit manufacture.

FIG. 1 is a flowchart illustrating a basic sol-gel-based process that has been previously proposed to deposit ELk films. As shown in FIG. 1, the first step is the synthesis of the stock precursor solution (step 100). The stock precursor solution is prepared, for example, by combining a soluble silicon oxide source (which may be a mixture of silicon oxide precursors) (e.g., tetraorthosilicate (TEOS), methyltriethoxysilane (MTES), etc.), water, a solvent, and an acid catalyst (e.g., nitric or an organic acid) in particular mole ratios at certain prescribed environmental conditions and by mixing the combination for certain time periods.

Once the stock solution is obtained, the coating solution is mixed (step 110). The general procedure for preparing the coating solution includes adding a porogen, such as a surfactant, to the stock solution. For example, porogens such as surfactants can be used as templates for the porous silicon oxide. Later in the process, the porogens are removed (i.e., calcined), leaving behind a porous silicon oxide film. The surfactants can be anionic, cationic, or nonionic. However, when forming dielectric layers for IC applications, non-ionic surfactants are generally preferred. The acid catalyst is added to accelerate the hydrolysis reactions of the silicate and aid in the condensation of the silicate species around the porogen.

After the coating solution is mixed, it is deposited on the substrate (step 120) using a spinning process. Centrifugal draining during the spinning process ensures that the substrate is uniformly coated with the coating solution. The coated substrate is then heated to continue the hydrolysis and condensation of the precursor and to remove low boiling solvents from the forming film (step 130).

The pre-baked substrate can then be further baked to form a hard-baked film (step 140). The temperature range chosen for the bake step will ensure that excess water and higher boiling solvents are removed. At this stage, the film is comprised of a hard-baked matrix of silicon oxide and porogen. An interconnected structure in the hard-baked matrix provides continuous pathways for the subsequently decomposed porogen molecules to escape from the forming porous oxide matrix.

Typical silicon oxide films often have hydrophilic pore walls and aggressively absorb moisture from the surrounding environment. If water, which has a dielectric constant (k) of about 78, is absorbed into the porous film, then the low k dielectric properties of the film can be detrimentally affected. Often these hydrophilic films are annealed at elevated temperatures to remove moisture and to decompose the porogen out of the silicon oxide-porogen matrix. A porous film exhibiting interconnected pores is produced after annealing (step 150). This is only a temporary solution in a deposition process, since the films may still be sensitive to moisture absorption following this procedure.

Some sol-gel processes include further post-deposition treatment steps that modify the surface characteristic of the pores to impart various desired properties, such as hydrophobicity, and increased resistance to certain chemicals. A typical treatment that renders the film more stable is treatment with HMDS (hexamethyldisilizane, [(CH$_3$)$_3$—Si—NH—Si—(CH$_3$)$_3$]) in a dehydroxylating process. HMDS removes hydroxyl groups and replaces them with trimethylsilyl groups to render the film hydrophobic (step 160). See U.S. Pat. No. 5,736,425. Alternatively, or in conjunction with the silylation step, the porous material may be rendered more hydrophobic by the addition of an alkyl substituted silicon precursor, such as methyl triethoxysilane, CH$_3$Si(OCH$_2$CH$_3$)$_3$, (MTES) to the precursor formulation. See EP 1,123,753. It has been found that replacement of a significant fraction of the TEOS with MTES (for example 20-80 wt %, preferably 30-70 wt %) in the liquid precursor formulation generates films exhibiting good resistance to moisture absorption without subsequent exposure to HMDS.

A variety of alternatives to the above-described sol-gel process for depositing ELk materials have been proposed. However, none of the alternatives is suitable for use in integrated circuit fabrication due to the unacceptable impurity types or poorly controlled or uncontrolled impurity levels associated with commercially available surfactant components in the precursor solutions used for porous ELk deposition.

In order for the film to be suitable and allow for a successful integration for IC fabrication, the film desirably has a controlled level of impurities or it is deposited using ingredients that have minimal levels of impurities that are harmful in silicon oxide-based insulator films in microelectronic devices. Impurities that are harmful in silicon oxide-based dielectric films include metal ions such as sodium and potassium which transport under the influence of an electric field and which are nonvolatile. These impurities are typically introduced into the film by the surfactants, which are used in templated porous oxide precursor formulations.

It is known in the semiconductor integrated circuit industry that alkali metal ions (such as sodium and potassium) are desirably excluded from silicon dioxide films used as MOS transistor insulators and multilevel interconnection insulators, because these positively-charged ions are mobile when exposed to electric fields. They drift away from the positively-biased film interface and toward the negatively-biased film interface, causing capacitance-voltage shifts. While the exclusion of sodium has received the most attention because of its ubiquitous presence and high mobility, other alkali ions, especially potassium and lithium, are also equally problematic and are also desirably excluded from insulator films. Alkali metal impurity specifications for chemical precursor solutions (e.g., TEOS) for integrated circuit applications typically set the allowable impurity levels to approximately 20 parts per billion maximum for each type of alkali metal, or other metal. Lower maximum allowable impurity levels may be possible in the future.

Therefore, there is a need to arrive at a formulation, which uses surfactants that do not contain impurities (or contains reduced amounts of impurities), and which can be used to produce good quality low dielectric constant films.

SUMMARY OF THE INVENTION

Embodiments of the present invention provide a process for forming porous silicon oxide-based films using a sol-gel approach utilizing a precursor solution formulation, which includes a purified surfactant such as a non-ionic surfactant, and an additive among other components. The additive is either an ionic additive or an amine additive which forms an ionic ammonium type salt in the acidic precursor solution. The precursor solution formulation enables the formation of a film having a dielectric constant less than 2.5, mechanical properties sufficient for IMD or PMD layers, and minimal levels of metal impurities (e.g., alkali metal impurities). In one embodiment, this is achieved by purifying the surfactant and adding ionic or amine additives such as tetraalkylammonium salts and amines to the stock precursor solution.

In some embodiments, the ionic additive is of the general composition [NR$_4$]$_z^+$A$^{z-}$, where R is a hydrogen atom or a monovalent organic group such as a hydrophobic ligand of chain length 1 to 24 or combinations thereof and z– is the valence of the anion A$^{z-}$. The cation in the above formula may include tetramethylammonium and cetyltrimethylammonium. A$^{z-}$ is an anion of any suitable charge, and may be chosen from the group consisting of formate, nitrate, oxalate, acetate, phosphate, carbonate, and hydroxide and combinations thereof. For example, tetramethylammonium salts, or more generally tetraalkylammonium salts, or tetraorganoammonium salts or organoamines in acidic media are added to surfactant templated porous oxide precursor formulations to increase the ionic content, replacing metal ion impurities (e.g., sodium and potassium) removed during surfactant purification. The added salts were found to provide beneficial effects in the resulting dielectric film.

These and other embodiments of the present invention as well as their advantages are described in more detail in conjunction with the description below and the attached figure.

DESCRIPTION OF THE SPECIFIC EMBODIMENTS

Figure 1:
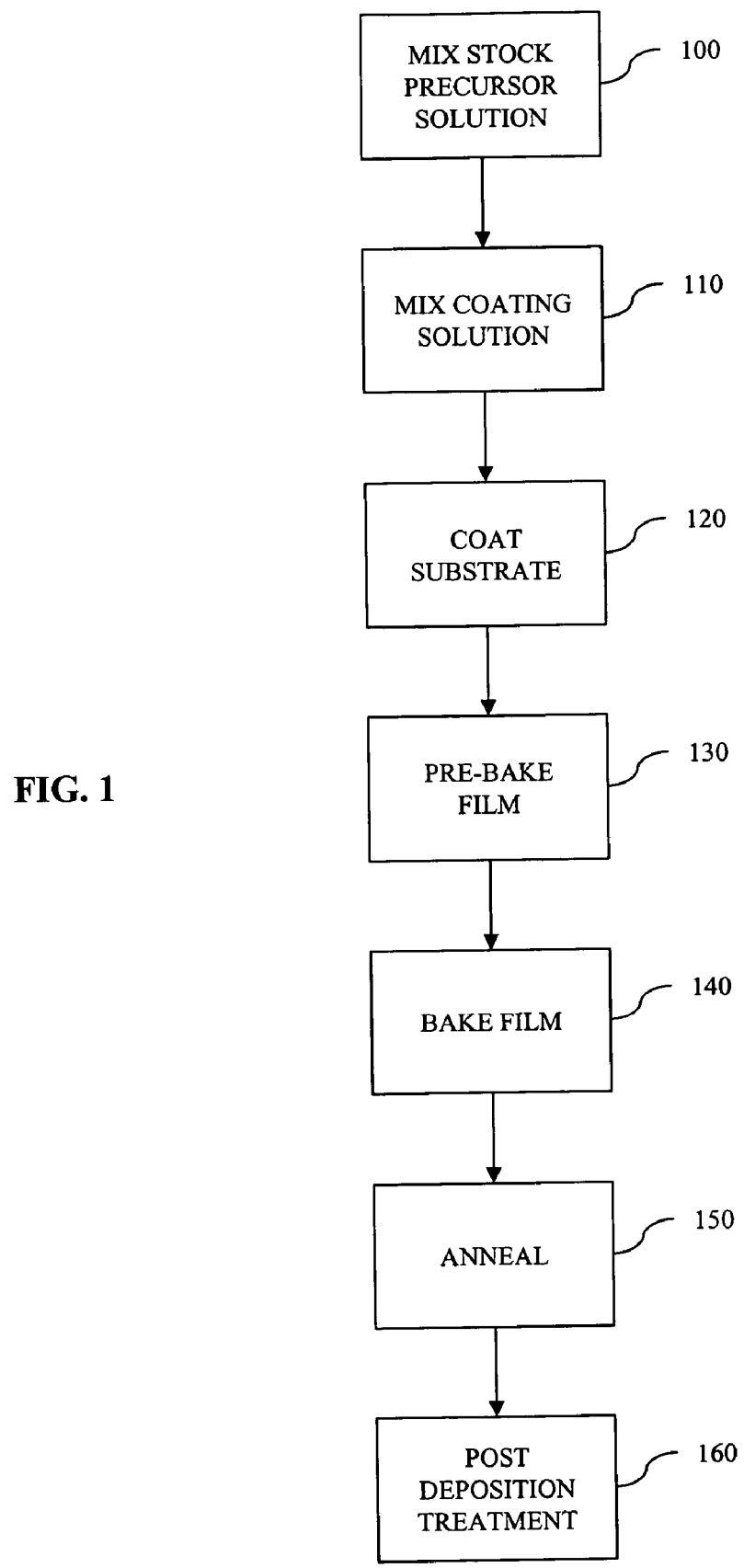
FIG. 1 is a flowchart of a typical process in which a templated sol-gel process is used to deposit a porous silicon oxide layer. Any of the steps shown in the flowchart can be used in embodiments of the invention.

Embodiments of the present invention are directed towards particular compositions for forming a porous silicon oxide dielectric layer. As used herein, "silicon oxide film", "silicon oxide dielectric layer", silicon oxide-based film or the like refers to a material that has silicon (Si) and oxygen (O) atoms, and possibly additional constituents such as, but not limited to, other elements such as H, B, C, P, or halide atoms or organic groups such as alkyl groups or aryl groups. A "dielectric layer" may include the above noted silicon oxide film, silicon oxide dielectric layer, silicon oxide-based film, or the like, or any derivative thereof. Preferably, the silicon oxide dielectric layer or film is formed from a silicon oxide source (which may include a single molecular species or a mixture of different molecular species) having a molecule with an organic group comprising carbon and hydrogen attached to a silicon atom. In some embodiments, the silicon oxide source material and/or silicon oxide dielectric layer may further comprise silicon-carbon bonds, and may have a total number of Si—C bonds to the total number of Si atoms greater than about 0.2, preferably ranging from between about 0.2 to about 3 mole ratios. Specifically, embodiments of the present invention use additives in conjunction with particular precursor formulations, which use purified surfactants. The surfactants are purified to remove impurities such metal ions (e.g., alkali metal ions), which are known to be detrimental to integrated circuit fabrication.

It is known in the semiconductor integrated circuit industry that alkali metal ions (such as sodium and potassium) are desirably excluded from silicon dioxide films used as metal oxide semiconductor (MOS) transistor insulators and multilevel interconnection insulators, because these positively-charged ions are mobile when exposed to electric fields. The positively-charged mobile ions drift away from the positively-biased film interface and toward the negatively-biased film interface, causing capacitance-voltage shifts. While the exclusion of sodium has received the most attention because of its ubiquitous presence and high mobility, the other alkali metal ions, especially potassium and lithium, are also desirably kept to acceptable levels. Alkali metal impurity specifications for chemical precursor solutions (e.g., TEOS) for integrated circuit applications are typically set to allow impurity levels of about 20 parts per billion maximum for each type of alkali metal.

The inventors have found that alkali metal ions have higher mobility in porous silicon oxide-based films than in the dense silicon oxide films that have generally been used for integrated circuits. Even cesium ions, which have very low mobility in dense silicon oxide films compared to sodium ions, appear to transport through porous ELk films under the influence of electric fields. Therefore, for porous silicon oxide-based films, metal (e.g., alkali metal) impurity concentrations in ELk film chemical precursor solutions are desirably less than the 20 parts per billion for each type of alkali metal. While these requirements may be relaxed in the future, control of alkali metal impurity concentration will still be desirable.

While commercially-available unpurified surfactants could be used in chemical formulations to form porous films with desired low dielectric constants, the final films will have impurity levels in excess of acceptable levels, and thus the surfactant is desirably purified. Surfactant purification can be performed using common procedures, such as by employing ion exchange columns in which alkali ions can be retained and hydrogen ions are released in their place. These unpurified surfactants may commonly possess alkali metal ion concentrations in the range of from about 100 to 1000 parts per million. The goal of surfactant purification is to reduce alkali metal ion impurity levels to less than 50 parts per billion. Acceptable concentrations of alkali metal ion impurities in ELk chemical precursor solutions are less than about 50 or less than about 10 parts per billion for each alkali metal ion.

It was discovered that a purified surfactant could be used to produce porous films with desired low dielectric constants if specific types of ionic or amine additives were added to the formulation in relatively low concentration. The inventors discovered that when depositing films from a precursor formulation with a surfactant that was purified (to contain alkali ion impurity levels to less than 50 parts per billion) to remove undesired alkali metal ion impurities (most notably sodium or potassium ions), the deposited films had relatively high dielectric constants, approaching that of dense silicon dioxide. Without being bound by theory, the inventors believe that this might be attributed to a failure to form a stable mesophase due to a weaker mesophase separation, and/or to a collapse of the porous structure during calcination.

In preferred embodiments, all reagents that are used are purified. The purified reagents include silicate sources, solvents, catalysts, and porogens. The resulting formulation desirably has a metal contamination level less than 20 ppb. Purification can take place using well known purification methods including ion exchange, flash distillation, and/or fractional vacuum distillation.

Generally, the ionic additive can be of the general composition $[NR_4]_z^+ A^{z-}$ where R is a hydrogen atom or a monovalent organic group such as a hydrophobic ligand of chain length 1 to 24 (e.g., $-CH_3$) or combinations thereof and z– is the valence of the anion $A^{z-}$. The cation in the above formulas may include tetramethylammonium and cetyltrimethylammonium. $A^{z-}$ is an anion, which may be chosen from the group consisting of formate, nitrate, oxalate, acetate, phosphate, carbonate, hydroxide, and combinations thereof. The anion $A^{z-}$ can have any charge value including 1–, 2–, or 3–. The ionic additive could also include, for example, ammonium chloride, ammonium hydroxide, of other salt of the general formula $(NH_4)_z^+ A^{z-}$, where $A^{z-}$ is an anion of any suitable charge and z– is the valence of the anion.

Tetramethylammonium salts, or more generally tetraalkylammonium salts, or tetraorganoammonium salts or organoamines in acidic media are added to the purified surfactant silicon oxide precursor formulations to increase the ionic content, replacing alkali ion impurities (sodium and potassium) removed during surfactant purification, but which are found to exhibit beneficial effects towards achieving low dielectric constants. In some embodiments, the ionic additive may be cationic in nature, have a high charge density, and may thermally decompose at temperatures less than about 450° C.

While the additive may be an ionic additive as is generally described above, the additive may alternately be an amine additive which forms an ionic ammonium type salt in the acidic precursor solution. While not being limited to any particular theory, the inventors suggest that the amine additive which forms an ionic ammonium type salt in the acidic precursor solution facilitates a pH shift during thermal processing of the film which may be useful to porous film formation.

The suitable amine additive is selected from the group consisting of:
TEDA, triethylenediamine, $(CH_2)_6N_2$;
DELA, diethanolamine, $(HOCH_2CH_2)_2NH$;
TELA, triethanolamine, $(HOCH_2CH_2)_3N$;
APDEA, aminopropyldiethanolamine, $(HOCH_2CH_2)_2N(CH_2CH_2CH_2NH_2)$;
PACM, bis(p-aminocyclohexyl)methane, $NH_2(C_6H_{10})CH_2(C_6H_{10})NH_2$;
QUIN, quinuclidine, $N(CH_2)_6CH$;
3-Quinuclidinol, $N(CH_2)_6CH$;
TMA, trimethylamine, $(CH_3)_3N$;
TMEDA, tetramethylethylendiamine, $(CH_3)_2NCH_2CH_2N(CH_3)_2$;
TMPDA, tetramethyl-1,3-propanediamine, $(CH_3)_2N(CH_2)_3N(CH_3)_2$;
TMA(O, trimethylamine oxide, $(CH_3)_3N(O)$;
PC-9, N,N,N-tris(N',N'-dimethyl-3-aminopropyl)amine, $((CH_3)_2NCH_2CH_2CH_2)_3N$;
PC-77, 3,3'-bis(dimethylamino)-N-methyldipropylamine, $((CH_3)_2NCH_2CH_2CH_2)_2NCH_3$;
CB, choline hydroxide, $HOCH_2CH_2N(CH_3)_3OH$;

DMAP, 4-dimethylaminopyridine, $(CH_3)_2N(C_6H_5N)$;
DPA, diphenylamine, $(C_6H_5N)_2NH$;
TEPA, tetraethylenepentamine, $HN(CH_2CH_2NHCH_2CH_2NH_2)_2$.

As can be recognized, numerous alternate embodiments of the ELk film may be deposited depending upon the choice of the spin-on solution ingredients, in particular, the surfactant, the additive, processing times, and process parameters. The ELk films deposited according to some embodiments of this invention exhibit the following properties:
- the film has Si—O and Si—C bonds
- a dielectric constant in the range between about 1.4 and about 2.5
- a porosity between about 20% and about 80%, preferably between 20 and 60%,
- a modulus of elasticity of between about 1.4 (or about 1.2) and about 10 GPa, and generally between about 2 (or about 1.5) and about 6 GPa
- a hardness value between about 0.2 (or about 0.1) and about 2.0 GPa, and generally between about 0.3 (or about 0.4) and about 1.2 GPa
- a refractive index at about 633 nm of between about 1.1 and about 1.5

Additive levels in the final ELk chemical precursor formulation are approximately in the range between 0.001 to 2000 parts per million, and in some embodiments, in the range between 1 and 500 parts per million.

As described above, a particular sol-gel-based process as shown in FIG. 1 may be used to deposit surfactant templated ELk films. As described by steps 100 to 160 of FIG. 1, an Elk film is formed by forming a templated sol-gel ELk chemical precursor formulation, spin coating a substrate with the precursor formulation and then thermally treating the coated substrate to form a porous dielectric layer thereon. Specific embodiments of the present invention are directed to particular methods for forming the precursor solution composition. These methods are described with reference to steps 100 and 110 of FIG. 1.

Specifically, the templated sol-gel ELk chemical precursor, according to embodiments of the present invention, is formulated by mixing two solutions and then adding the purified surfactant to the mixture of the two solutions, where a first solution is obtained by mixing a soluble silicon oxide source (e.g., TEOS) (and which may include an alkyl substituted silicon precursor such as MTES), and a solvent; and where a second solution is obtained by mixing water, the acid catalyst and the additive. As described above, the additive is an ionic additive or alternately an amine additive which forms an ionic ammonium type salt in the acidic precursor formulation as described above.

Alternately, the templated sol-gel ELk chemical precursor, according to another embodiment of the present invention is formulated by mixing together two solutions, where a first solution is obtained by mixing a soluble silicon oxide source (e.g., TEOS) (optionally an alkyl substituted silicon precursor such as MTES), a solvent and the purified surfactant, and where a second solution is obtained by mixing together water, the acid catalyst and the additive, and further where the additive is an ionic additive or alternately an amine additive which forms an ionic ammonium type salt in the acidic precursor formulation as described above.

Yet, in other alternate precursor formulations, the purified surfactant is added to the solution containing the water, the acid and the additive instead of the solution containing the soluble source of silicon oxide. It is desirable to form two separate solutions where one is the solution containing the solvent, the water, the acid and the additive and the other is the solution containing the silicon oxide source and the solvent. The surfactant can be added to either of the solutions. Forming the final precursor solution from these two solutions enables the creation of two long-shelf-life solutions, which is commercially advantageous over other highly reactive solutions having a relatively short shelf life. The final precursor solution formed by mixing the two solutions has a much shorter shelf life than the two separate solutions. For example, each of the two separate solutions are chemically stable with a shelf life of over 6 months, while the final precursor formulation which is used to coat substrates is chemically stable for a shorter period. Another advantage of forming a final precursor solution from the two long-shelf life solutions is that it enables the formation of highly reactive mixture before coating the substrates. The highly reactive mixture will allow for a quicker cure of the coated substrates to form a stable film in a reduced time. Thus, a deposition apparatus can be developed to first mix the two long-shelf-life solutions together to form the more reactive formulation mixture to be applied to the wafer.

When the precursor solutions are mixed together, the final coating solution may comprise a soluble source of silicon oxide (which may include a mixture of silicon sources), an ionic or amine additive, a solvent, a surfactant, a catalyst, and water. Derivatives of any of these components may also be present in the final coating solution. For example, an ionic additive with a cationic component and an anionic component may dissociate in solution and may thus be derived from the ionic additive. The acid catalyst may also produce derivative components in solution such as anions.

The soluble source of silicon oxide may include silicon/oxygen compounds that are selected from the group consisting of tetraethylorthosilicate (TEOS), tetramethoxysilane, phenyltriethoxysilane, methyltriethoxysilane (MTES), 1,1,3,3-tetraethoxy-1,3-dimethyldisiloxane, and combinations thereof. The soluble source of silicon oxide may be a compound represented by the following: $R_aSi(OR^1)_{4-a}$, wherein R represents a hydrogen atom or a monovalent organic group; $R^1$ represents a monovalent organic group; and a is an integer ranging from 1 to 3; $Si(OR^2)_4$, where $R^2$ represents a monovalent organic group; or $R^3{}_b(R^4O)_{3-b}Si—(R^7)—Si(OR^5)_{3-c}R^6{}_c$, wherein $R^3$ to $R^6$ may be the same or different and each represents a monovalent organic group; b and c may be the same or different and each is a number ranging from 0 to 3 wherein the sum of b and c is 5 or less; $R^7$ represents an oxygen atom, a phenylene group, or a group represented by —$(CH_2)_n$—, wherein n is an integer of 1 to 6; or combinations thereof. The term "monovalent organic group" as used herein relates to an organic group bonded to an element of interest, such as Si or O, through a single C bond, i.e., Si—C or O—C.

Any suitable ionic additive or amine additive can be included in the final solution. Suitable ionic additive or amine additives are described above.

The solvent can include an alcohol such as methanol, ethanol, isopropanol, propylene glycol monopropyl ether, n-propanol, n-butanol, t-butanol, ethylene glycol and combinations thereof. Other solvents can include propylene glycol methyl ether acetate, as well as glycol ethers and glycol ether acetates.

The surfactant can be a cationic, non-ionic, or an anionic surfactant. Non-ionic surfactants are preferred and may be selected from the group consisting of block co-polymers, including polyethylene oxide-polypropylene oxide-polyethylene oxide triblock co-polymers (such as the Pluronics line of surfactants marketed by BASF), the Brij line of surfactants marketed by ICI (which are alcohol ethoxylates), octaethylene glycol monodecyl ether, octaethylene glycol monohexadecyl ether, Triton™ X-100, Triton™ X-114, Triton™ X-45, and related compounds and combinations thereof. The particular unpurified surfactant used was from the Triton™ series offered by Dow Chemical and more specifically the Triton™ X-114 surfactant, which is an octylphenol ethoxylate-type surfactant (generically an alkyl phenol ethoxylate surfactant). A propoxylated surfactant could also be used. The use of the X-114 surfactant results in films having smaller and more uniform pore sizes, than other non-Triton surfactants listed.

Any suitable catalyst can be used. The catalysts can be acid catalysts such as non-halide acid catalysts. Examples of acid catalysts include acetic acid, formic acid, glycolic acid, glyoxylic acid, oxalic acid and nitric acid.

The precursor solution may also comprise water or other aqueous medium.

The various components in the coating solution that is coated on the substrate can be in suitable proportions that are effective to form a porous silicon oxide film comprising silicon, oxygen, carbon, and hydrogen. It is understood that those skilled in the art can adjust the proportions of components in any precursor solutions used to make the final coating solution that will be used to coat the substrate. In some embodiments, the final coating solution may have the following percentages of components in the following molar proportions (moles of each reagent divided by the sum of the moles of all reagents in the formulation, excluding any by-products such as ethanol that may be generated, for example, by the hydrolysis of the silicon oxide source):

soluble source of silicon oxide (e.g., TEOS, MTES)—greater than about 0% to about 40%;
 ionic additive or amine additive—about 0.00001% to about 4%;
 solvent—about 10% to about 70%;
 surfactant—about 0.01% to about 4%;
 catalyst—about 0.01% to about 4%; and
 water—about 10% to about 80%, or even about 90%.

Any suitable apparatus or process may be used to deposit the coating solution. An example of such a deposition apparatus that can be used to deposit the coating solution is described in copending U.S. application Ser. No. 09/692,660, assigned to Applied Materials, Inc., and entitled "ULTRASONIC SPRAY COATING OF LIQUID PRECURSOR FOR LOW K DIELECTRIC COATINGS," which is hereby incorporated herein by reference in its entirety. In other embodiments, spin coating, doctor blade coating, curtain coating, and other coating processes can be used to coat a substrate with the coating solution.

Once deposited on a substrate, the coating solution may be further processed to produce a porous silicon oxide film. The steps 130, 140, 150, and 160 that are described above with respect to FIG. 1 may be used to further process the coated coating solution on the substrate. In some embodiments, no processing temperature is higher than 425° C. and no process step is performed for longer than 5 minutes. Also in some embodiments, steps 130 and 140 may be combined into one step, and step 160 could be optionally omitted in some embodiments. Other treatments that could be performed include UV processing, radiation cures, electron beam cures, etc. Also, in some cases, the incorporation of carbon into the film eliminates the need for chemical post treatments.

Other embodiments may use different processing conditions than those processing conditions described above. For example, in an exemplary annealing step to remove surfactant from the porous structure, the annealing may take place at any suitable pressure including atmospheric pressure (760 Torr), 600 Torr, $10^{-6}$ Torr, or less than any of these specific pressures. The annealing atmosphere may include an inert gas, air, or an $O_2$/inert gas mixture (e.g., less than 10% gas $O_2$ with the balance being inert gas). In a specific example, the gases that are used in the annealing process may include inert gases and up to about 21% $O_2$ (by volume or by moles) (e.g., 3% $O_2$ in $N_2$ at about 600 Torr). In some cases, surfactants can be stripped from the porous structure using a surfactant strip chamber, which may be a CVD chamber or a plasma processing chamber.

The substrates may be batch processed or non-batch processed. A dual substrate processing system can be used to increase throughput and staged cures can be used to minimize stress in the formed porous silicon oxide film. For example, two or more stages can be used to cure a coating solution on a substrate. In a first processing stage, a first hotplate may be at a first temperature in the range from about 80-250° C. (e.g., 100-200° C.). The processing time may be between about 60 seconds to about 2 minutes. One, two, or three or more hotplates can be used to process the substrate in this first stage. More hotplates can be used to provide gradual hardening and limit temperature shock. In the first processing stage, the forming film hardens and the solvent evaporates. In a second processing stage, a second hotplate may be at a second temperature in the range from about 350-450° C. In this second stage, the processing time may range between about 120 and about 360 seconds. A hotplate, a cure chamber, or a surfactant strip chamber could be used in this second processing stage. During the second processing stage, the forming film further hardens.

The porous silicon oxide films that are eventually formed can have a low dielectric constant. The films may have a dielectric constant below about 2.7, 2.5, or even below 2.0. In some embodiments, the dielectric constant may range between about 1.2 to about 2.7.

Embodiments of the present invention are further described by comparing example formulations prepared in accordance with the method of the present invention (Invention Example 1) to two comparative examples. The comparative examples, (i.e., Comparative Examples 1 and 2) describe prior art processes including: a basic precursor solution formulation using industrially available (unpurified) surfactants (i.e., Comparative Example 1); and variant formulations using a purified surfactant (i.e., Comparative Example 2). An example of the invention (i.e., Invention Example 1) describes formulations which has additional amounts of additives added to compensate for the effects of the material impurities removed by purification of the surfactant.

Before describing the purified formulation (Comparative Example 2) or formulations having additives (Invention Example 1), an example of a precursor formulation using an unpurified surfactant is described below (Comparative Example 1). This example (Comparative Example 1) serves as a foundation for the remaining examples.

COMPARATIVE EXAMPLE 1

Precursor Formulation Using an Unpurified Surfactant

This example describes a prior art process for preparing a precursor formulation using an unpurified surfactant to form a porous oxide-based film. Using this formulation, an ELk film was deposited according to a sol-gel-based process as described above by steps 100-150. During steps 100-150 a precursor solution comprising at least one silicon oxide precursor composed primarily of a silicon/oxygen compound, water, a solvent, a surfactant and a catalyst was formed. The precursor solution was spun on the wafer and the wafer thermally treated by being baked in a chamber at various temperatures between about 90° C. and 450° C. for between about 30 and 3600 seconds in inert or oxidizing environments having pressures in the range from about 0.1 Torr to atmospheric. In particular, the specific precursor formulation used in this example (Comparative Example 1) had the following composition: tetraethoxysilane (TEOS)—22.5 grams; methyltriethoxysilane (MTES)—22.5 grams; propylene glycol monopropyl ether (PGPE)—46.72 grams; 0. 1N nitric acid—24 grams; and Triton X-114-9.67 grams (Triton X-114 is trademark of a mixture of ethoxylated p-tert-octylphenols manufactured by the Dow Chemical).

The inventors deposited silicon oxide-based films using the commercially available nonionic surfactants, which contain alkali metal impurities. Alkali metal impurities are commonly present in commercial surfactants in the range between about 100 to 1000 parts per million. While these films possessed the necessary requirements for microelectronic devices including very low dielectric constants (less than 2.5), good adhesion, high modulus of elasticity, and small pore size, the presence of unacceptable levels of alkali metal ion impurities contained within the surfactant, rendered these silicon oxide-based films unacceptable for microelectronic applications. As described above, acceptable levels of alkali metal impurity concentrations in ELk chemical precursor solutions are less than 20 parts per billion for each type of alkali metal, and preferably less than 10 parts per billion for each alkali element.

Therefore, the inventors developed a formulation, which could be used to form ELk films having minimal levels of impurities by using an improved surfactant in the precursor formulation. An improved surfactant for this formulation is readily purifiable by distillation, ion exchange chromatography, or ideally can be prepared without the use of problematic impurities such as alkali metal compounds.

COMPARATIVE EXAMPLE 2

Precursor Formulation Using a Purified Surfactant

This example describes a process for the formation of precursor formulation using a purified surfactant to deposit a film. The difference between the formulation of this example (Comparative Example 2) and the specific formulation of the previous example (Comparative Example 1) is that the formulation in this example uses a purified form of the Triton™ surfactant, i.e., one where the alkali metal impurities were removed from the surfactant before it was added to the coating solution. Alkali metal impurities in the purified surfactant were approximately less than 50 parts per billion. Surfactant purification can be performed using common procedures, such as employment of ion exchange columns in which alkali ions can be retained and hydrogen ions released in their place. Using this formulation, an ELK film was deposited based on a sol-gel process as described above by steps 100-150.

However, once the inventors deposited films using the purified surfactants, an unexpected result was discovered in that the films collapsed to a thickness much lower than that expected and the films' dielectric constant increased to unacceptable values (higher than 3.0). The increase in the dielectric constant is believed to be at least due to the loss of porosity in the film. Thus, the inventors found that the absence of the alkali metal ion impurities detrimentally impacts the properties of the final film using such a purified formulation.

INVENTION EXAMPLE 1

Precursor Formulation Using a Purified Surfactant and Additives and Effects of Additives This example describes specific formulations for depositing porous silicon oxide-based films using a sol-gel-based process utilizing a precursor solution formulation, which includes a purified nonionic surfactant and an ionic additive in accordance with embodiments of the present invention. Alkali metal impurities in the purified surfactant were approximately less than 50 parts per billion. The difference between the formulation of this example (Invention Example 1) and the formulation of the previous example (Comparative Example 2) is the addition of the additive to the precursor formulation as is described below. Using this precursor solution formulation the deposited films' properties meet the requirements of having a dielectric constant less than or equal to 2.5, and high porosity, while containing minimal levels of alkali metal impurities.

In particular formulations, tetramethylammonium salts including tetramethylammonium formate, tetramethylammonium nitrate, tetramethylammonium oxalate, tetramethyl ammonium hydroxide and tetramethylammonium acetate were added to the precursor formulation. The precursor solution was then formulated by adding the additive to a first solution containing the water and the acid and adding this first solution to a second solution containing the TEOS, the MTES, the solvent and the surfactant. Three specific types of films were prepared using three specific additive-enhanced formulations. These three film types were formed on wafers 2-7 as shown on Table 1 below. The amounts and type of additives for the three formulations are shown below in Table 1. The surfactant used for all cases shown in Table 1 is a the Triton™ 114 surfactant purified to remove alkali metal ion impurities.

TABLE 1

| Wafer No. | Solution Used | Additive | Thickness-Å | K |
|---|---|---|---|---|
| 1. | Purified 114 | None | 4055 | 3.30 |
| 2. | Purified 114 | 0.25 g of 25% of tetramethyl ammonium formate | 5903 | 2.12 |
| 3. | Purified 114 | 0.05 g of 25% of tetramethyl ammonium nitrate | 5907 | 2.14 |
| 4. | Purified 114 | 700 ppm tetramethyl ammonium hydroxide (TMAH) | 4630 | 2.26 |
| 5. | Purified 114 | 100 ppm TMAH | 6480 | 2.28 |
| 6. | Purified 114 | 30 ppm TMAH | 6268 | 2.27 |
| 7. | Purified 114 | 15 ppm TMAH | 6409 | 2.24 |

Table 1 provides the dielectric constant data of films deposited from various precursor formulations shown in Table 1. As can be seen from this table, the effect of the addition of the tetramethylammonium salts is dramatic. For example, the formulation used to deposit the oxide-based film on wafer 1 used no ionic additive. As can be seen from on Table 1, wafer 1's deposited film thickness is 4055 Å having a dielectric constant of 3.3. On the other hand, by the addition of 0.25 g of tetramethylammonium formate to the precursor solution, the results shown for wafer 2 were obtained, which had a deposited film thickness of 5903 Å and a dielectric constant of 2.12. Similar results were obtained with the addition of 0.05 g of tetramethylammonium nitrate to the precursor solution before depositing the film on wafer 3. It was noted that the films did not collapse after calcinations.

The formulation used to form a porous oxide film on wafers 4, 5, 6 and 7 used a 2.4 wt. % solution of tetramethylammonium hydroxide (TMAH) solution as an additive. The quantity of the additive added to the solution ranged from 700 ppm to 15 ppm relative to the precursor formulation. As can be seen from the results in Table 1, TMAH also results in the formation of thicker films as compared to the films formed using a purified surfactant where no additive was present in the formulation. These results confirm the utility of this approach for restoration of the desired film properties for IMD or other electronic applications.

Having fully described several embodiments of the present invention, many other equivalent or alternative methods of forming a precursor solution for depositing a porous oxide film according to the present invention will be apparent to those skilled in the art. For example, the ionic additives could be added to either the stock or the coating precursor solution. These equivalents are intended to be included within the scope of the present invention which is set forth in the following claims.

All patents and patent applications mentioned above are herein incorporated by reference in their entirety for all purposes. None of the patents or patent applications or associated descriptions thereof is admitted to be prior art.

What is claimed is:

1. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film,
    wherein said ionic additive or the amine additive is a compound selected from the group consisting of (a) tetraalkylammonium salts, (b) tetraorganoammonium salts, and (c) organoamines in acidic media and combinations thereof.

2. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film,
    wherein said ionic additive or the amine additive is a compound chosen from the group consisting of tetraalkylammonium salts and salts with the general composition $[NR_4]_z^+ A^{z-}$, where R is hydrogen or a monovalent organic group of chain length 1 to 24, and $A^{z-}$ is an anion.

3. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film,
    wherein said ionic additive or the amine additive is added to said solution in an amount in the range between 0.1 and 2000 parts per million.

4. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film,
    wherein said ionic additive or the amine additive is (a) a tetramethylammonium salt or (b) a salt exhibiting complete decomposition to volatile species upon heating to a temperature between 300 and 450° C.

5. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film,
    wherein said ionic additive or the amine additive is a compound of the general composition $[NR_4]_z^+ A^{z-}$, where R is hydrogen or a monovalent organic group of chain length 1 to 24, and $A^{z-}$ is an anion, which is chosen from the group consisting of formate, nitrate, oxalate, acetate, phosphate, carbonate and hydroxide and combinations thereof.

6. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film,
    wherein said ionic additive is a tetramethylammonium salt chosen from a group of compounds consisting of tetramethylammonium formate, tetramethylammonium nitrate, tetramethylammonium oxalate, tetramethylammonium acetate, tetramethylammonium hydroxide and other salt exhibiting complete decomposition to volatile species upon heating to a temperature between 300 and 450° C.

7. A process for forming a dielectric layer over a substrate, said process comprising:
    coating said substrate with a solution formed from a soluble source of silicon oxide, a solvent, a surfactant, an ionic additive or an amine additive, and an acid catalyst; and
    treating said coated substrate to harden said solution into a porous silicon oxide film
    wherein the ionic additive is of the composition $[NR_4]_z^+ A^{z-}$, where R is hydrogen or a monovalent organic group of chain length 1 to 24, and $A^{z-}$ is an anion chosen from the group consisting of formate, nitrate, oxalate, acetate, phosphate, carbonate, hydroxide, and combinations thereof.

8. A process for forming a dielectric layer over a substrate, said process comprising:
    coating said substrate with a solution formed from a soluble source of silicon oxide, a solvent, a surfactant, an ionic additive or an amine additive, and an acid catalyst; and treating said coated substrate to harden said solution into a porous silicon oxide film, wherein the soluble source of silicon oxide is in an amount above 0% to about 40%;

the ionic additive or amine additive is in an amount between about 0.00001% to about 4%;

the solvent is in an amount between about 10% and about 70%;

the surfactant is in an amount between about 0.01% and about 4%;

the acid catalyst is in an amount between about 0.01% to about 4%; and wherein the coating solution further comprises water in an amount between about 10% to about 80%, wherein the percentages are molar percentages based on the total moles in the coating solution, excluding any byproducts generated through chemical reaction, and wherein the soluble source of silicon oxide comprises tetraethylorthosilicate and methyltriethoxysilane, wherein the molar ratio of methyltriethoxysilane to tetraethylorthosilicate and methyltriethoxysilane is from about 0.4 to 0.7.

9. The process of claim 8 wherein the acid catalyst comprises nitric acid and wherein the composition comprises the ionic additive, and the ionic additive comprises tetramethylammonium hydroxide.

10. A process for forming a dielectric layer over a substrate, said process comprising:

coating said substrate with a solution formed from a soluble source of silicon oxide, water, a solvent, a nonionic surfactant, an ionic additive or an amine additive, and an acid catalyst; and treating said coated substrate to harden said solution into an porous silicon oxide film, wherein said nonionic surfactant is first purified to remove alkali metal impurities; and wherein said ionic additive is selected from the group consisting of (a) tetraalkylammonium salts, (b) tetraorganoammonium salts, (c) organoamines in acidic media and combinations thereof.

11. A process for forming a dielectric layer over a substrate, said process comprising:

coating said substrate with a solution formed from a soluble source of silicon oxide, water, a solvent, a nonionic surfactant, an ionic additive, and an acid catalyst; and treating said coated substrate to harden said solution into a porous silicon oxide film, wherein said nonionic surfactant is first purified to remove alkali metal impurities; and wherein said ionic additive is a tetramethylammonium salt chosen from a group of compounds consisting of tetramethylammonium formate, tetramethylammonium nitrate, tetramethylammonium oxalate, tetramethylammonium acetate, tetramethylammonium hydroxide and other salt exhibiting complete decomposition to volatile species upon heating to a temperature between 300 and 450° C.

12. A process for forming a dielectric layer over a substrate, said process comprising:

coating said substrate with a solution formed from a soluble source of silicon oxide, water, a solvent, a nonionic surfactant, an ionic additive, and an acid catalyst; and treating said coated substrate to harden said solution into a porous silicon oxide film, wherein said nonionic surfactant is first purified to remove alkali metal impurities; and wherein said ionic additive is of the general composition $[NR_4]_z^+ A^{z-}$, where R is hydrogen or a monovalent organic group of chain length 1 to 24, and $A^{z-}$ is an anion, which is chosen from the group consisting of formate, nitrate, oxalate, acetate, phosphate, carbonate, and hydroxide and combinations thereof.

13. A process for forming a dielectric layer over a substrate, said process comprising:

coating said substrate with a solution formed from a soluble source of silicon oxide, a solvent, a surfactant, an ionic additive or an amine additive, and an acid catalyst; and treating said coated substrate to harden said solution into a porous silicon oxide film, wherein treating comprises (i) heating the coated substrate at a temperature between about 80° C. to about 250° C. in a first stage, and (ii) heating the coated substrate between about 350° C. to about 450° C. in a second stage, wherein the ionic additive is of the general composition $[NR_4]_z^+ A^{z-}$, where R is hydrogen or a monovalent organic group of chain length 1 to 24, and $A^{z-}$ is an anion, which is chosen from the group consisting of formate, nitrate, oxalate, acetate, phosphate, carbonate, and hydroxide and combinations thereof.

* * * * *